US010527942B2

(12) United States Patent
Sim et al.

(10) Patent No.: US 10,527,942 B2
(45) Date of Patent: Jan. 7, 2020

(54) COATING COMPOSITIONS FOR USE WITH AN OVERCOATED PHOTORESIST

(71) Applicant: Rohm and Haas Electronic Materials Korea Ltd., Cheonan, Chungcheongnam-Do (KR)

(72) Inventors: Jae Hwan Sim, Chungcheongnam-do (KR); Jung Kyu Jo, Gyeonggi-do (KR); EunHye Cho, Chungcheongnam-do (KR); Hye-Won Lee, Gyeonggi-do (KR); Jin Hong Park, Gyeonggi-Do (KR); Eui-Hyun Ryu, Chungcheongnam-Do (KR); Jae-Bong Lim, Chungcheongnam-Do (KR)

(73) Assignee: Rohm and Haas Electronics Materials Korea Ltd., Cheonan, Chungcheongnam-do (KR)

( * ) Notice: Subject to any disclaimer, the term of this patent is extended or adjusted under 35 U.S.C. 154(b) by 0 days.

(21) Appl. No.: 15/363,533

(22) Filed: Nov. 29, 2016

(65) Prior Publication Data

US 2017/0153547 A1    Jun. 1, 2017

Related U.S. Application Data

(60) Provisional application No. 62/261,275, filed on Nov. 30, 2015.

(51) Int. Cl.
| | | |
|---|---|---|
| *G03F 7/09* | (2006.01) | |
| *G03F 7/20* | (2006.01) | |
| *C08L 35/06* | (2006.01) | |
| *G03F 7/30* | (2006.01) | |
| *G03F 7/40* | (2006.01) | |
| *C09D 167/02* | (2006.01) | |
| *C09D 125/18* | (2006.01) | |
| *H01L 21/02* | (2006.01) | |
| *C08F 220/34* | (2006.01) | |
| *H01L 21/027* | (2006.01) | |
| *C08F 220/38* | (2006.01) | |
| *C08F 220/26* | (2006.01) | |
| *H01L 21/311* | (2006.01) | |
| *C08F 220/18* | (2006.01) | |
| *C08F 220/30* | (2006.01) | |
| *C08F 220/32* | (2006.01) | |
| *C08G 63/685* | (2006.01) | |
| *C08G 63/78* | (2006.01) | |
| *C09D 5/00* | (2006.01) | |
| *C09D 133/08* | (2006.01) | |

(Continued)

(52) U.S. Cl.
CPC ............ *G03F 7/091* (2013.01); *C08F 220/18* (2013.01); *C08F 220/26* (2013.01); *C08F 220/30* (2013.01); *C08F 220/32* (2013.01); *C08F 220/34* (2013.01); *C08F 220/38* (2013.01); *C08G 63/685* (2013.01); *C08G 63/78* (2013.01); *C08L 35/06* (2013.01); *C09D 5/006* (2013.01); *C09D 125/18* (2013.01); *C09D 133/08* (2013.01); *C09D 133/14* (2013.01); *C09D 167/00* (2013.01); *C09D 167/02* (2013.01); *G03F 7/162* (2013.01); *G03F 7/168* (2013.01); *G03F 7/20* (2013.01); *G03F 7/2006* (2013.01); *G03F 7/30* (2013.01); *G03F 7/327* (2013.01); *G03F 7/40* (2013.01); *H01L 21/0276* (2013.01); *H01L 21/02282* (2013.01); *H01L 21/02343* (2013.01); *H01L 21/31133* (2013.01); *C08F 2220/302* (2013.01); *C08F 2220/325* (2013.01); *C08L 2666/04* (2013.01)

(58) Field of Classification Search
CPC ... G03F 7/004; G03F 7/11; G03F 7/20; G03F 7/30; G03F 7/40; G03F 7/094; C08L 2666/04; C08L 35/06; C09D 167/02; C09D 125/18; C09D 5/006; C08F 220/26; C08F 220/34; C08F 220/38; H01L 21/0276; H01L 21/02282; H01L 21/02343; H01L 21/31133
USPC .......... 430/270.1, 271.1, 311, 322, 325, 330, 430/329, 331; 438/636; 524/386; 526/326; 528/363, 364
See application file for complete search history.

(56) References Cited

U.S. PATENT DOCUMENTS

| | | |
|---|---|---|
| 5,677,112 A | 10/1997 | Urano et al. |
| 6,818,381 B2 | 11/2004 | Khojasteh et al. |

(Continued)

FOREIGN PATENT DOCUMENTS

| | | |
|---|---|---|
| EP | 2000852 A1 | 12/2008 |
| JP | 2003-226982 A | 8/2003 |

(Continued)

OTHER PUBLICATIONS

English Language summary of Taiwanese Office Action and Search Report dated Jul. 4, 2017 of counterpart Taiwan Application 105136436 (8 pages).

(Continued)

*Primary Examiner* — Amanda C. Walke
(74) *Attorney, Agent, or Firm* — Mintz Levin Cohn Ferris Glovksy and Popeo, P.C.; Peter F. Corless

(57) ABSTRACT

In a preferred aspect, organic coating compositions, particularly antireflective coating compositions for use with an overcoated photoresist, are provided that comprise 1) one or more glycidyl groups; and 2) one or more aromatic groups that each comprises two or more substituents that comprise hydroxy, thiol and/or amine moieties. Catechol-containing polymers and methods for producing same also are provided.

7 Claims, No Drawings

(51) Int. Cl.
*C09D 133/14* (2006.01)
*C09D 167/00* (2006.01)
*G03F 7/16* (2006.01)
*G03F 7/32* (2006.01)

(56) References Cited

U.S. PATENT DOCUMENTS

| | | | |
|---|---|---|---|
| 6,927,015 B2 | 8/2005 | Khojasteh et al. | |
| 7,846,638 B2 | 12/2010 | Kishioka et al. | |
| 8,101,156 B2* | 1/2012 | Pacetti | A61L 27/34 424/1.65 |
| 8,281,247 B2 | 10/2012 | Daniell et al. | |
| 8,338,078 B2 | 12/2012 | Hatakeyama et al. | |
| 8,450,042 B2* | 5/2013 | Hatakeyama | C08F 12/24 430/270.1 |
| 8,808,960 B2* | 8/2014 | Akita | C07C 69/00 430/270.1 |
| 2002/0015909 A1* | 2/2002 | Mizutani | G03F 7/091 430/270.1 |
| 2002/0123586 A1* | 9/2002 | Hong | G03F 7/091 526/266 |
| 2002/0137826 A1* | 9/2002 | Jung | C07C 251/66 524/287 |
| 2008/0102649 A1 | 5/2008 | Takei et al. | |
| 2008/0227942 A1* | 9/2008 | Benderly | C07C 67/08 526/313 |
| 2009/0035704 A1 | 2/2009 | Zhuang et al. | |
| 2009/0087799 A1* | 4/2009 | Tachibana | C09D 125/18 430/323 |
| 2010/0151381 A1* | 6/2010 | Tachibana | C09D 133/16 430/270.1 |
| 2015/0322219 A1 | 11/2015 | Someya et al. | |

FOREIGN PATENT DOCUMENTS

| | | |
|---|---|---|
| JP | 2009-098639 A | 5/2009 |
| JP | 2015-018223 A | 1/2015 |
| JP | 2015-507223 A | 3/2015 |
| KR | 10-2009-0033104 A | 4/2009 |
| TW | 201430501 A | 8/2014 |
| TW | 201437766 A | 10/2014 |
| WO | 03/067329 A1 | 8/2003 |
| WO | 2004/090640 A1 | 10/2004 |

OTHER PUBLICATIONS

English Language summary of Korean Office Action dated Nov. 8, 2017 issued in counterpart Korean Application No. 10-2016-0151375 (7 pages).

English Language summary of First Notification of Reason for Refusal dated Oct. 26, 2017 in Japanese Patent Application No. 2016-220509 (7 pages).

English Language summary of JP H06-035201 (1 page).

* cited by examiner

COATING COMPOSITIONS FOR USE WITH AN OVERCOATED PHOTORESIST

CROSS-REFERENCE TO RELATED APPLICATION

This application claims priority to U.S. Provisional Application No. 62/261,275, filed Nov. 30, 2015. The contents of the foregoing application is incorporated herein by reference in its entirety.

BACKGROUND

The present invention relates to compositions and, in particular, antireflective coating compositions for use in microelectronic application In a preferred aspect, compositions of the invention comprise 1) one or more glycidyl groups; and 2) one or more aromatic groups that each comprises two or more substituents that comprise hydroxy, thiol and/or amine moieties. Preferred compositions of the invention are used with an overcoated photoresist composition and may be referred to as bottom antireflective compositions or "BARCs".

Photoresists are photosensitive films used for the transfer of images to a substrate. A coating layer of a photoresist is formed on a substrate and the photoresist layer is then exposed through a photomask to a source of activating radiation. Following exposure, the photoresist is developed to provide a relief image that permits selective processing of a substrate.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer (antireflective composition layer) interposed between the substrate surface and the photoresist coating layer. See U.S. Pat. Nos. 8,338,078; 6,927,0152; 5,677,112; 8,481,247; 8,012,670; 6,818,381; and 7,846,638; WO067329A1; and EP2000852.

$SiO_2$, TiN and other metals are common substrates on which photoresist and antireflective compositions are coated. Silicon oxynitride (SiON) layers and other inorganics such as $Si_3N_4$ coatings have been employed in semiconductor device manufacture, for example as an etch stop layer and an inorganic antireflective layer. See U.S. Pat. Nos. 6,124,217; 6,153,504; and 6,245,682.

Dry etching is a frequently preferred of pattern transfer with a photoresist relief image. The plasma used however in a dry etch process can cause damage to thin oxide and nitride layers, such as may be employed in flash memory fabrication. As a consequence, wet etching is often used for pattern transfer trough such more fragile substrates due to relatively milder condition of wet etch processes.

Wet etching of metal nitrides, such as titanium nitride (TiN), has been carried out using either an aqueous mixture of ammonium hydroxide and hydrogen peroxide, or a mixture of an acid such as sulfuric acid and a peroxide such as hydrogen peroxide. See, for instance, US 2006/0226122.

A problem with such using conventional wet etchants is their lack of selectivity. These wet etchants often attack surrounding structures, resulting in either etching or, particularly in the case of some photoresists, swelling and/or loss of adhesion to substrates to which the photoresist is applied. Such lack of selectivity becomes increasingly less acceptable as critical dimensions continue to be reduced.

It thus would be desirable to have new antireflective compositions for use with an overcoated photoresist. It would be particularly desirable to have new antireflective compositions that exhibit enhanced performance and could provide increased resolution of an image patterned into an overcoated photoresist. It also would be desirable to have new antireflective compositions for application onto metal substrate surfaces and that would provide good resolution and metal substrate adherence including through a wet etching process.

SUMMARY

We now provide new coating compositions that can be used with overcoated photoresist compositions. In preferred aspects, coating compositions of the invention can function as an effective antireflective layer for an overcoated resist layer.

In preferred embodiments, organic coating compositions, particularly antireflective compositions for use with an overcoated photoresist, are provided that can exhibit enhanced adhesion to an underlying metal substrate surface, such as a substrate surface comprising $SiO_2$ or TiN. In preferred aspects, such enhanced adhesion can be exhibited through wet etching processing of an underlying metal layer such as $SiO_2$ or TiN, or wet etching of a coating layer that overlies a metal layer such as a metal layer comprises an oxide or nitride e.g. $SiO_2$ or TiN.

We have found that underlying coating composition of the invention can provide surprisingly good lithographic performance, including during a wet etching process. Among other things, underlying coating compositions of the invention can provide good adherence to a metal substrate, such as a $SiO_2$ or TiN substrate surface, including throughout a post-development wet etching process. See, for instance, the results set forth in the Examples, which follow.

In preferred aspects underlying coating compositions are provided that comprise one or more materials that comprise 1) one or more glycidyl groups; and 2) one or more aromatic groups that each comprises two or more substituents that comprise hydroxy, thiol and/or amine moieties.

In certain aspects, the coating composition may comprise 1) a first resin that comprises one or more glycidyl groups and 2) a second resin that comprises one or more aromatic groups that each comprises two or more substituents that comprise hydroxy, thiol and/or amine moieties.

In other aspects, the coating composition may comprise a resin that comprises both 1) one or more glycidyl groups and 2) one or more aromatic groups that each comprises two or more substituents that comprise hydroxy, thiol and/or amine moieties.

In particularly preferred aspects, the coating compositions comprises a material that comprises aromatic groups that comprise catechol moieties, e.g. resins that comprise catechol group such as either pendant groups or repeat units of the resin backbone.

For antireflective applications, underlying compositions of the invention also preferably contain a component that comprises chromophore groups that can absorb undesired radiation used to expose the overcoated resist layer from reflecting back into the resist layer. A resin or other material may comprise such chromophore groups, such as single or fused ring aromatics e.g. optionally substituted phenyl, naphthyl or anthracenyl.

In another embodiment, new catechol-containing polymers are provided. In preferred aspects, a catechol reagent is reacted with a preformed resin to provide a resin with pendant catechol moieties.

In use with an overcoated photoresist, a coating composition may be applied on a substrate such as a semiconductor wafer which may have one or more organic or inorganic coating layers thereon.

As discussed, coating compositions of the invention may be particularly useful for application over an oxide or nitride substrate surface, such as $SiO_2$ or TiN.

The applied coating layer may be optionally thermally treated prior to overcoating with a photoresist layer. Such thermal treatment may cause hardening including crosslinking of the coating composition layer. Such crosslinking may include hardening and/or covalent-bonding forming reactions between one or more composition components and can modulate water contact angle of the coating composition layer.

Thereafter, a photoresist composition may be applied over the coating composition layer followed by imaging of the applied photoresist composition layer with patterned activating radiation and the imaged photoresist composition layer is developed to provide a photoresist relief image.

The substrate with resist relief image then may be wet etched, for example treatment with an alkaline wet etchant composition such as an aqueous mixture of ammonium hydroxide and hydrogen peroxide, or treatment with an acidic wet etchant such as an aqueous mixture of sulfuric acid and hydrogen peroxide.

A variety of photoresists may be used in combination (i.e. overcoated) with a coating composition of the invention. Preferred photoresists for use with the underlying coating compositions of the invention are chemically-amplified resists, including photoresists that contain one or more photoactive compounds and a resin component that contains units that undergo a deblocking or cleavage reaction in the presence of photogenerated acid.

In preferred aspects, the photoresist composition is designed for a negative-tone resist where the light-exposed regions remains after development process, but positive tone development can be also employed to remove the exposed portions of the photoresist layer.

The invention further provides methods for forming a photoresist relief image and novel articles of manufacture comprising substrates (such as a microelectronic wafer substrate) coated with a coating composition of the invention alone or in combination with a photoresist composition.

The invention also includes processes that comprise wet etching of substrate areas bared by an overcoated photoresist relief image.

Other aspects of the invention are disclosed infra.

DETAILED DESCRIPTION

Coating Compositions

As discussed above, in a preferred aspect, organic coating compositions, particularly antireflective compositions for use with an overcoated photoresist, are provided that comprise one or more materials that comprise 1) one or more glycidyl groups; and 2) one or more aromatic groups that each comprises two or more substituents that comprise hydroxyl (—OH), thiol (S<) and/or amine (—N<) moieties. It is understood that such hydroxyl, thio or amine group may have an O, S or N atom directly linked to an aromatic ring atom (e.g. carbon atom of the aromatic ring), or one or more atoms other than O, S or N may be interposed between the O, S or N atom of the respective hydroxyl, thio or amine moiety and the aromatic ring.

Preferred aromatic group substituents include moieties that have one or more O, S and/or N atoms, particularly moieties that comprise hydroxyl, amine or thio moieties. In certain aspects, preferred are moieties where a hetero (O, S or N) atom is directly linked to an aromatic ring, e.g. aromatic ring substituents selected from —OH, —SR and —NRR where each R is independently hydrogen or a non-hydrogen substituent such as optionally substituted $C_{1-20}$alkyl. In additional aspects, preferred are moieties where a hetero (O, S or N) atom is spaced from an aromatic ring, e.g. by one or more optionally substituted carbon atoms, including optionally substituted $C_{1-20}$alkyl (includes $C_{1-20}$alkylene), optionally substituted $C_{1-20}$heteroalkyl (includes $C_{1-20}$heteroalkylene) and heteroalicyclic including $C_{1-20}$alkoxy, optionally substituted $C_{1-20}$alkylthio, and optionally substituted $C_{1-20}$alkylamine.

The two or more hetero-containing substituents may be present at any of a variety of positions on an aromatic group. In certain aspects, an aromatic group will have two hetero-containing substituents present at adjacent ring positions (e.g., ortho relationship in a phenyl ring). In other aspects, two hetero-containing substituents may be separated by a minimum of 1, 2, 3 or more aromatic ring positions interposing between the two hetero-containing ring positions.

Generally preferred materials that comprise glycidyl and/or hetero-substituted aromatic groups are resins. For instance, as discussed above, preferred coating compositions may comprise 1) a first resin that comprises one or more glycidyl groups and 2) a second resin that comprises one or more aromatic groups that each comprises two or more substituents that comprise hydroxy, thiol and/or amine moieties. Additional preferred coating compositions may comprise a resin that comprises both 1) one or more glycidyl groups and 2) one or more aromatic groups that each comprises two or more substituents that comprise hydroxy, thiol and/or amine moieties.

Suitable glycidyl groups may be provided for instance by polymerizing a monomer that comprises a glycidyl moiety such as an acrylate compound exemplified by the following:

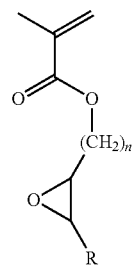

where in the immediately above structure n is a positive integer suitably from 1 to 20, more typically 1 to 8, and R is hydrogen or a non-hydrogen substituents such as optionally substituted $C_{1-20}$ alkyl.

Suitable aromatic groups that comprise multiple hetero (N, O, S)-containing substituents also may be provided for instance by polymerizing a monomer that comprises a suitable hetero (N, O, S)-substituted aromatic group (e.g. phenyl) such as an acrylate compound exemplified by the following:

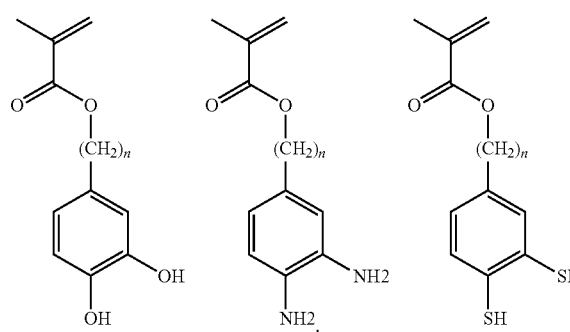
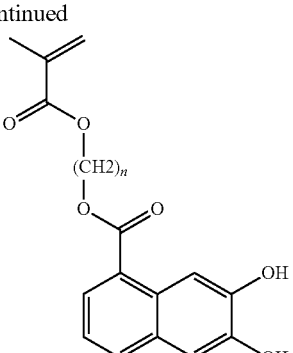
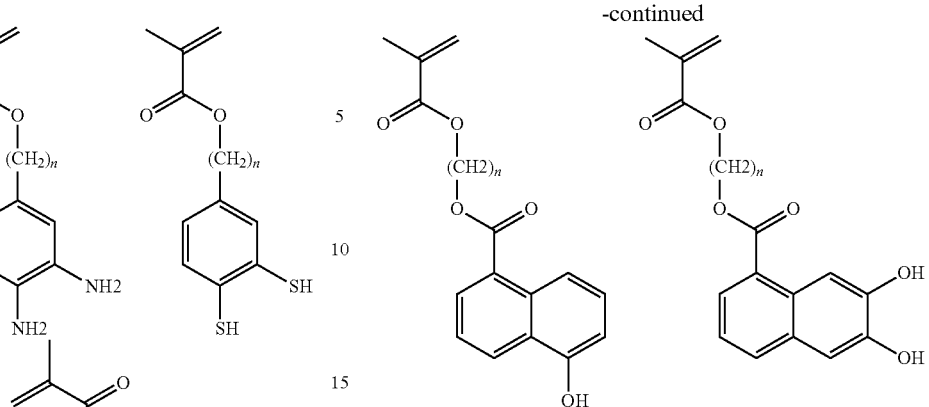

where in the immediately above structures n is a positive integer such as from 1 to 20, more typically 1 to 8.

Suitable chromophore groups may be provided in a resin for instance by polymerizing a monomer that comprises a suitable chromophore moiety such as a single ring or fused ring aromatic, particularly optionally substituted phenyl, naphthyl or anthracenyl such as an acrylate compound exemplified by the following:

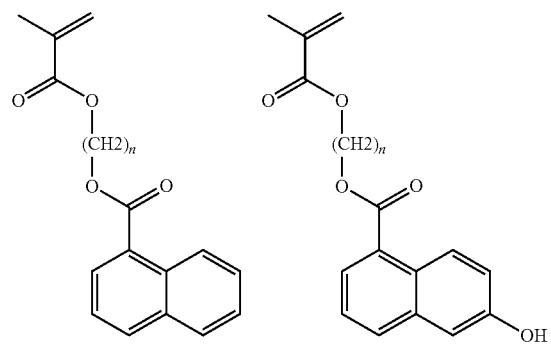
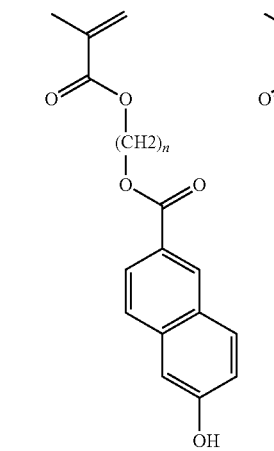
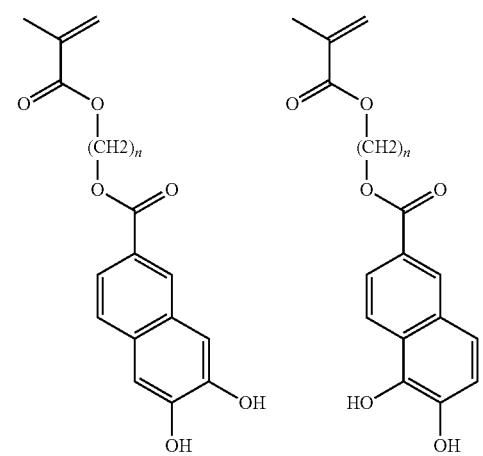

-continued
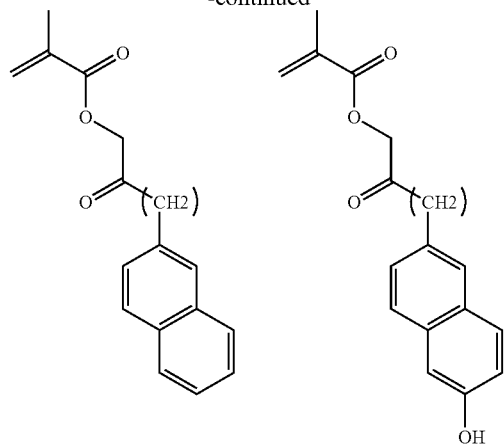
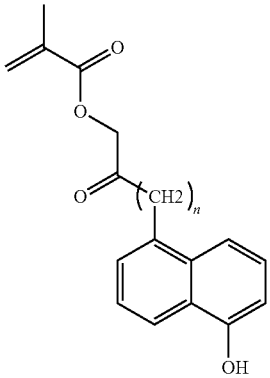
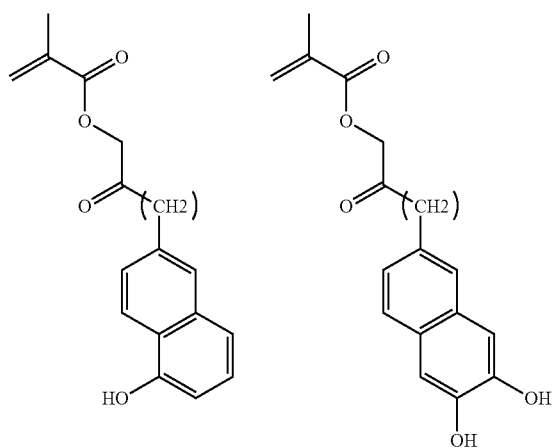
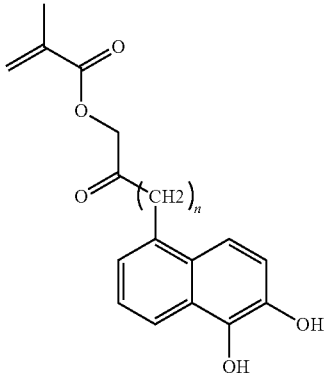
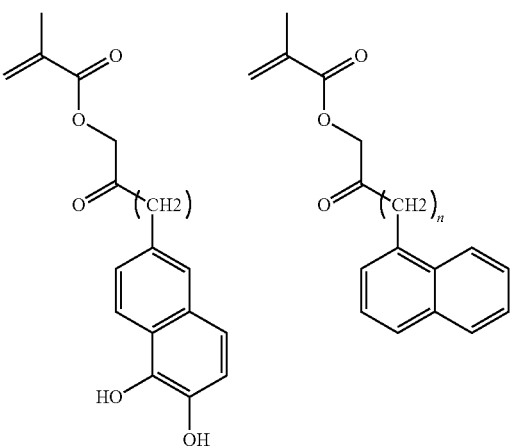
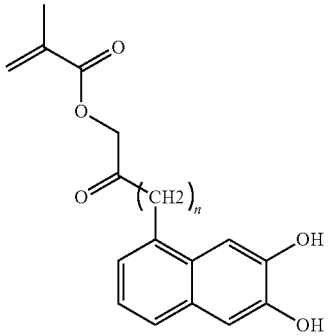
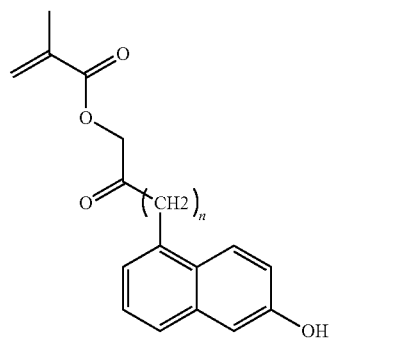
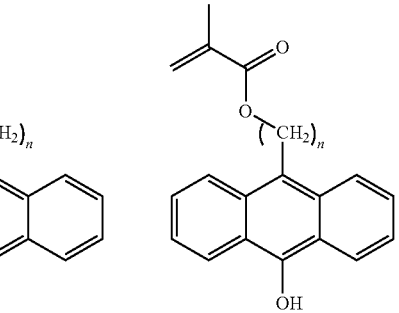

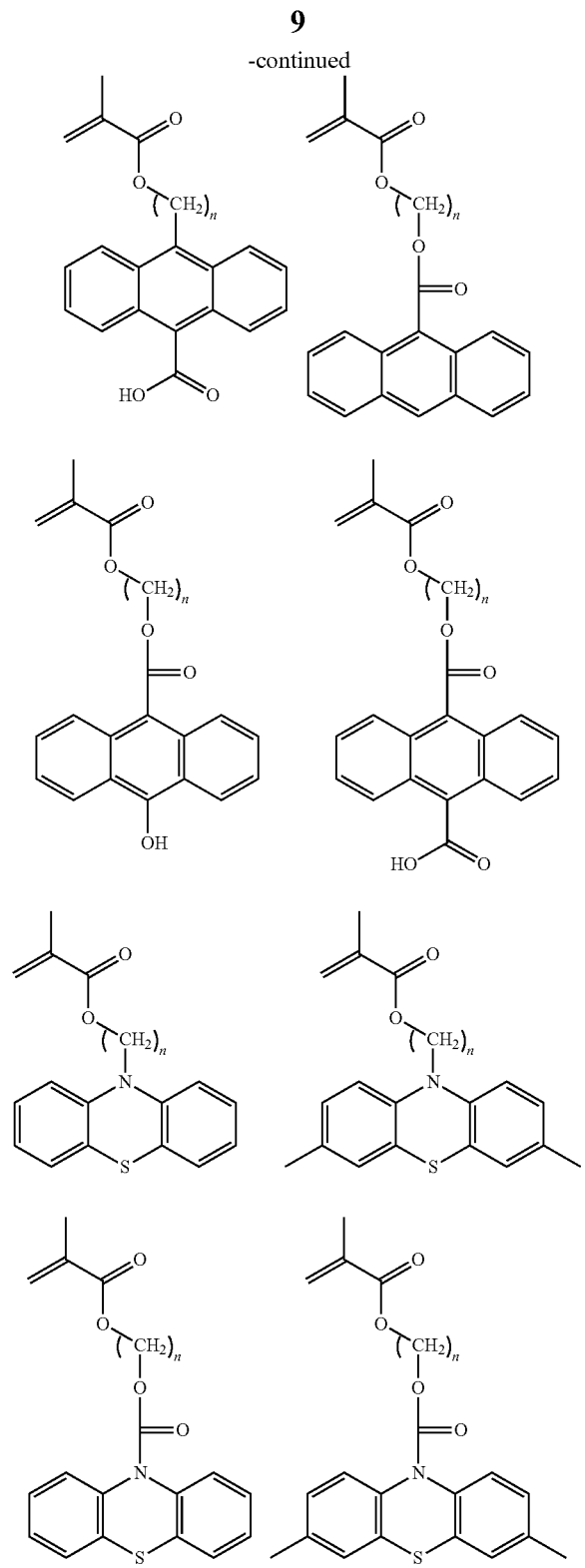
where in the immediately above structures n is a positive integer suitably from 1 to 20, more typically 1 to 8.
Resins useful in coating compositions of the invention suitably may comprise further units in addition to glycidyl-containing units and hetero-substituted aromatic units such as units provided by polymerization of any of the following compounds:
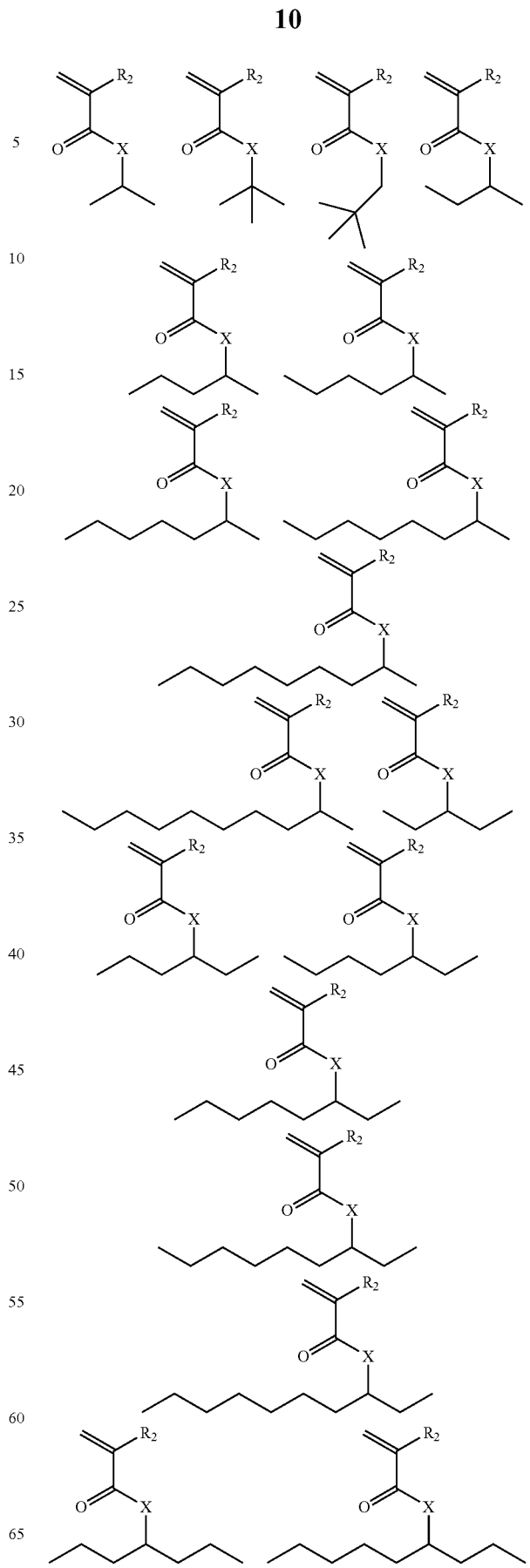

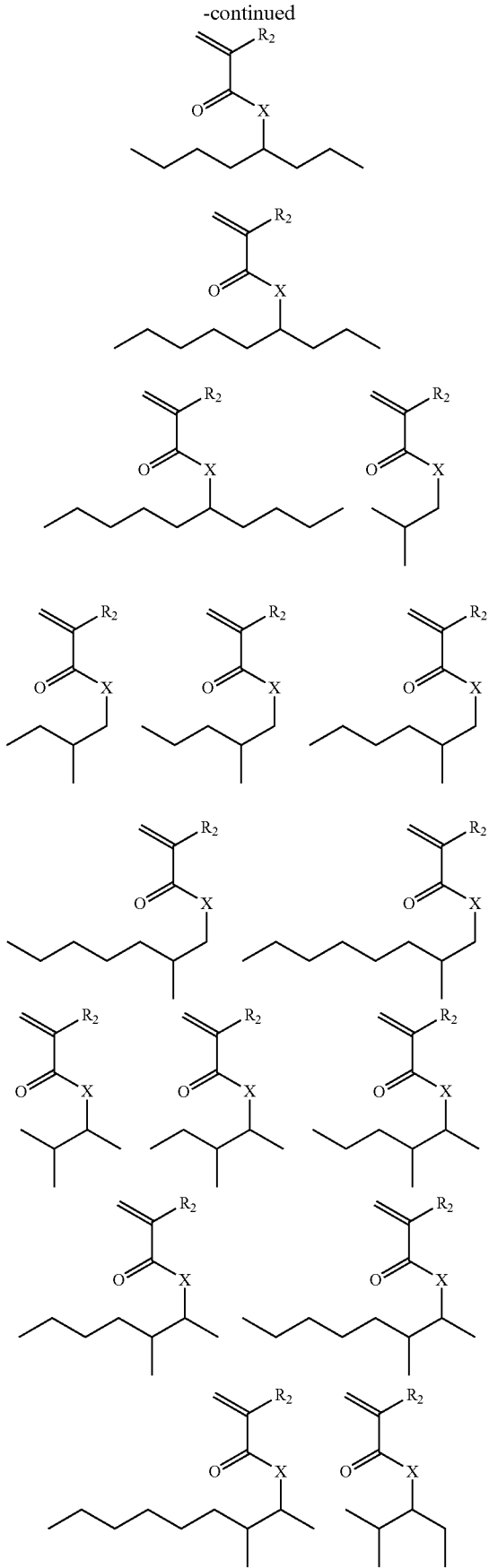
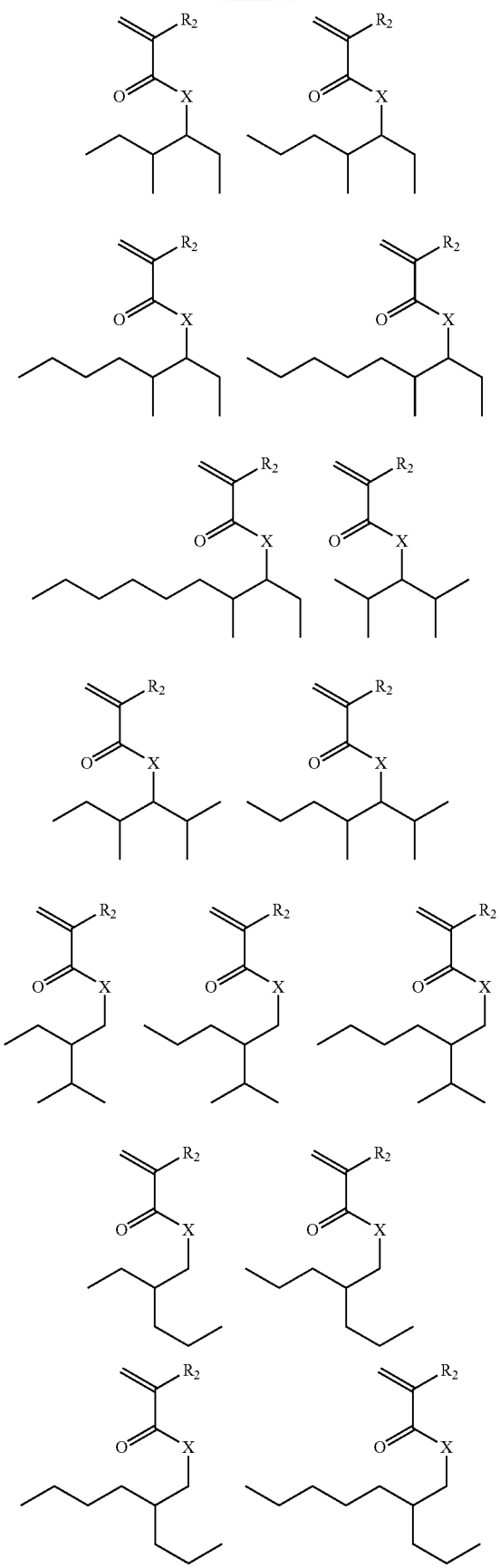

-continued
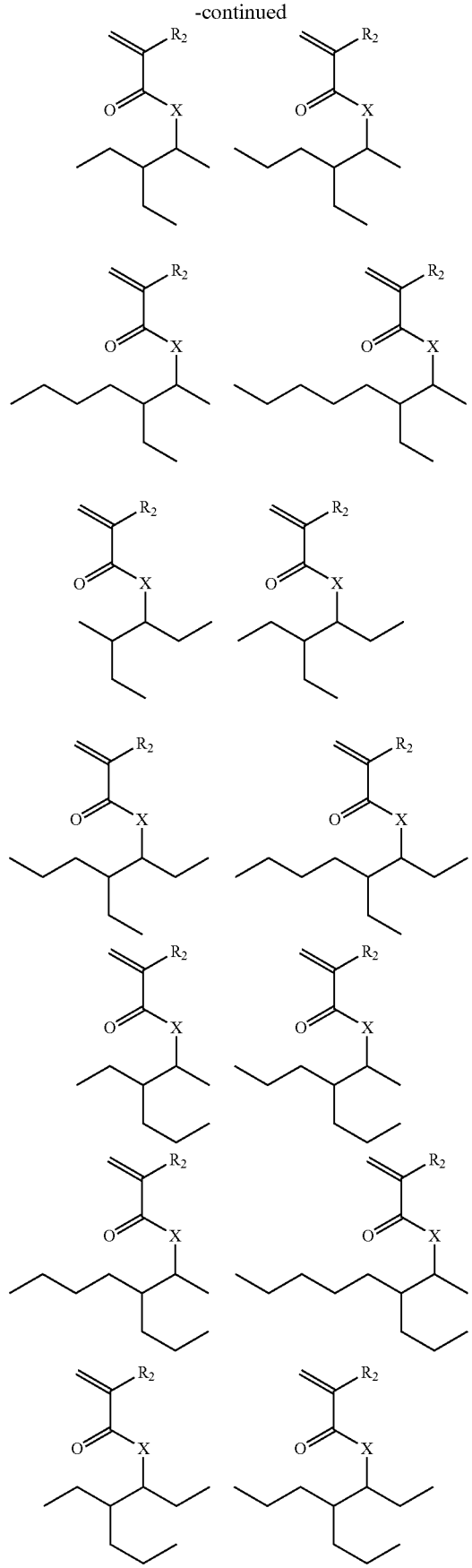
-continued
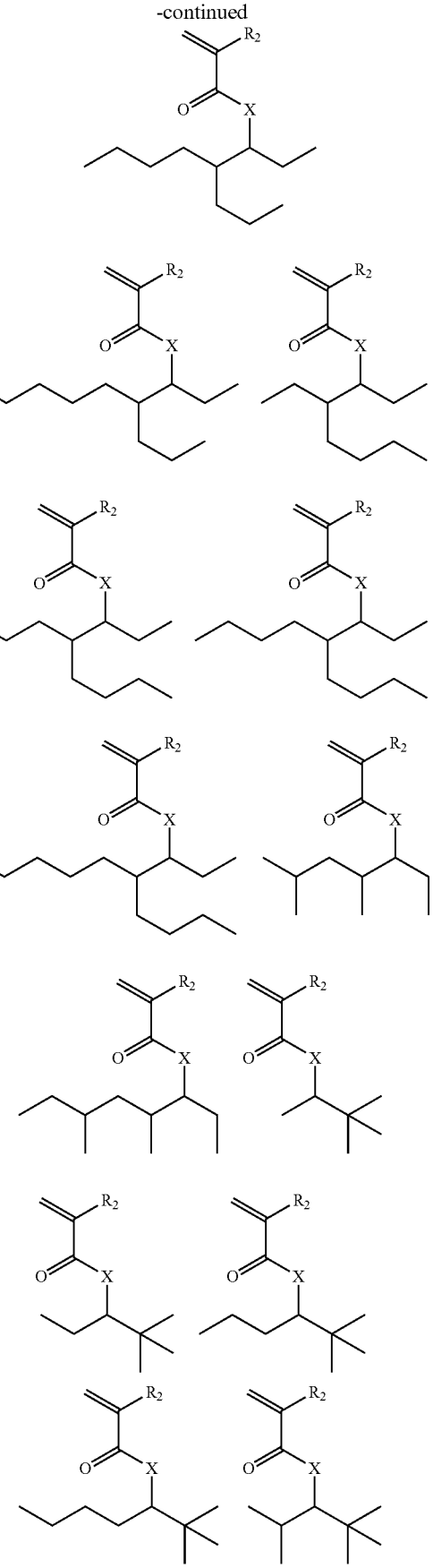

-continued

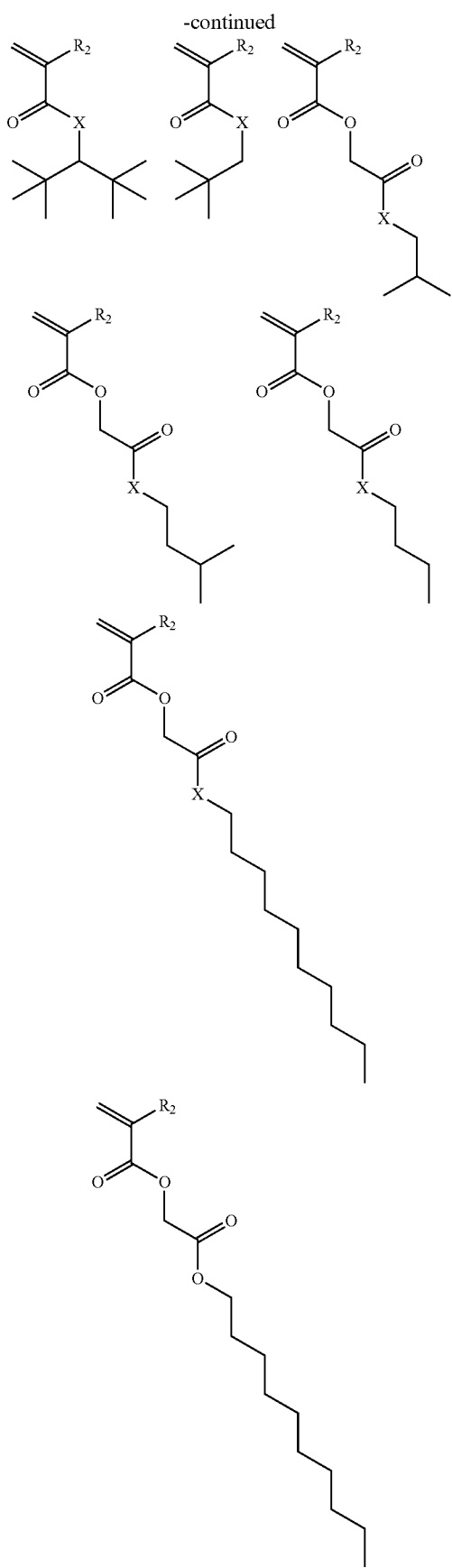

where in the immediately above structures $R_2$ is suitably hydrogen or a non-hydrogen substituent such as optionally substituted $C_{1-20}$alkyl including methyl and X is carbon or a hetero (O, S or N) atom.

Specifically preferred resins for use in coating compositions of the invention include the following:

1) Resins that comprise 1) glycidyl groups, 2) aromatic groups with multiple hetero-containing substituents such as hydroxyl, and 3) chromophore groups such as anthracenyl groups, as exemplified by the following resin where the values x, y and z designate respective mole amounts of each repeat unit in the resin and may each suitably independently vary from 10 to 80 mole percent.

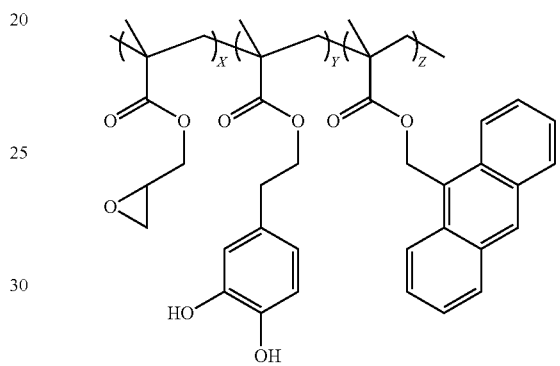

2) Resins that comprise 1) glycidyl groups, 2) chromophore groups such as anthracenyl groups, and 3) optional third units which are different than an aromatic group with multiple hetero-containing ring substituents, as exemplified by the following resins where in the first resin the values x, y and z alone the resin backbone designate respective mole amounts of each repeat unit in the resin and x and z may each suitably independently vary from 5 to 95 mole percent and x may vary from 0 to 80 mole percent. In the first resin shown immediately below, the group X shown in the middle unit and pendant from the backbone may be a variety of groups including optionally substituted C1-20alkyl, optionally substituted carbocyclic aryl and optionally substituted heteroaryl.

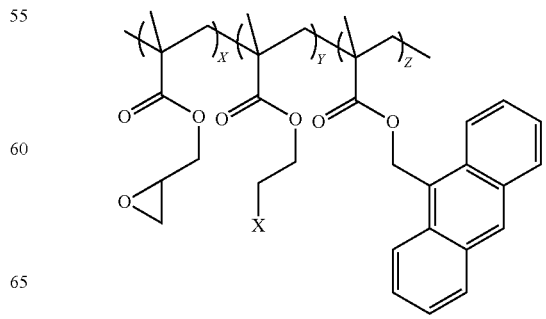

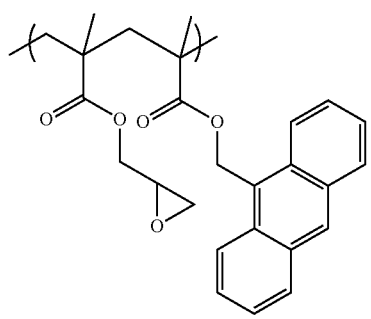

3) Resins that comprise 1) glycidyl groups, 2) an aromatic group with multiple hetero-containing ring substituents, and 3) optional third units as exemplified by the following resins where in the first resin the values x, y and z alone the resin backbone designate respective mole amounts of each repeat unit in the resin and x and z may each suitably independently vary from 5 to 95 mole percent and x may vary from 0 to 80 mole percent. In the first resin shown immediately below, the group X shown in the middle unit and pendant from the backbone may be a variety of groups including optionally substituted $C_{1-20}$alkyl, optionally substituted carbocyclic aryl and optionally substituted heteroaryl.

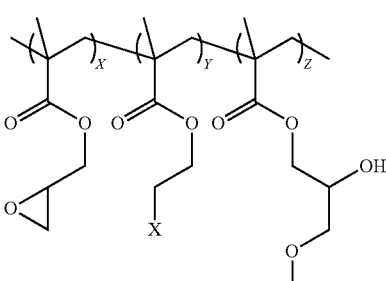

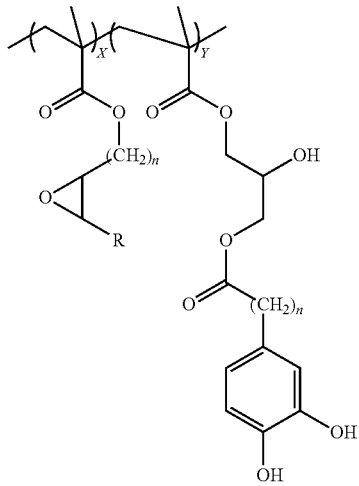

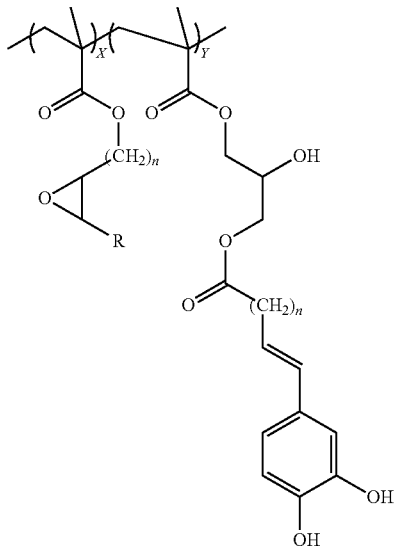

in the three resin structures immediately above, each suitably n suitably can be a positive integer from 1 to 20, more typically an integer from 1 to 8, and R is hydrogen or non-hydrogen substituents such as optionally substituted C1-20 alkyl.

4) Resins (including homopolymers or copolymers) that comprise units with than an aromatic group with multiple hetero-containing ring substituent such as the following exemplary 1) catecholated novolac; and 2) acrylate-based resins:

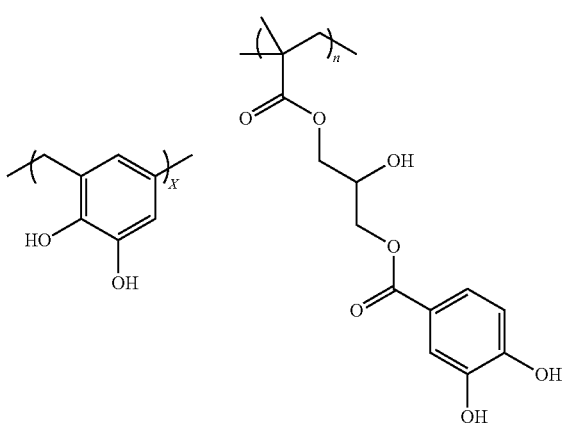

5) Resins (including homopolymers or copolymers) that comprise glycidyl units such as the following acrylate-based resins:

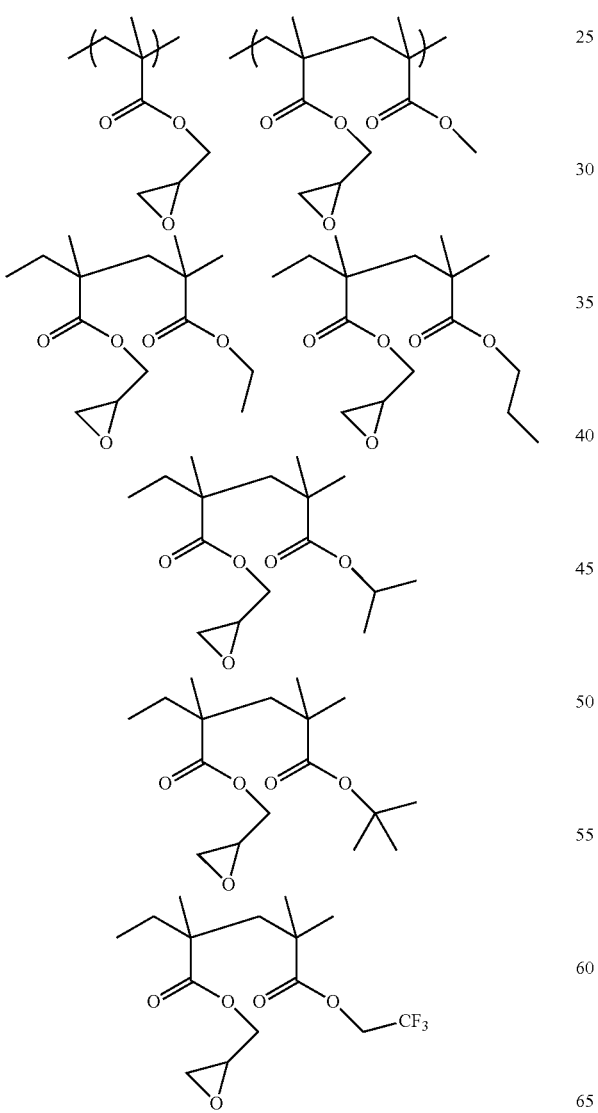

As discussed above, in a further embodiment, new catechol-containing polymers are provided. In preferred aspects, a catechol reagent is reacted with a preformed resin to provide a resin with pendant catechol moieties. For instance, a catechol reagent, such as a dihydroxyphenyl compound with a further reactive substituent such as an acid or amine group may be reacted with a polymer having reactive group such as epoxy.

Thus, for instance, as exemplified in Scheme 1 below, a polymer with reactive groups such as the depicted acrylate resin with glycidyl moiety is reacted with a catechol reagent that comprises one or more moieties reactive with the polymer to provide the polymer reaction product with pendant catechol groups.

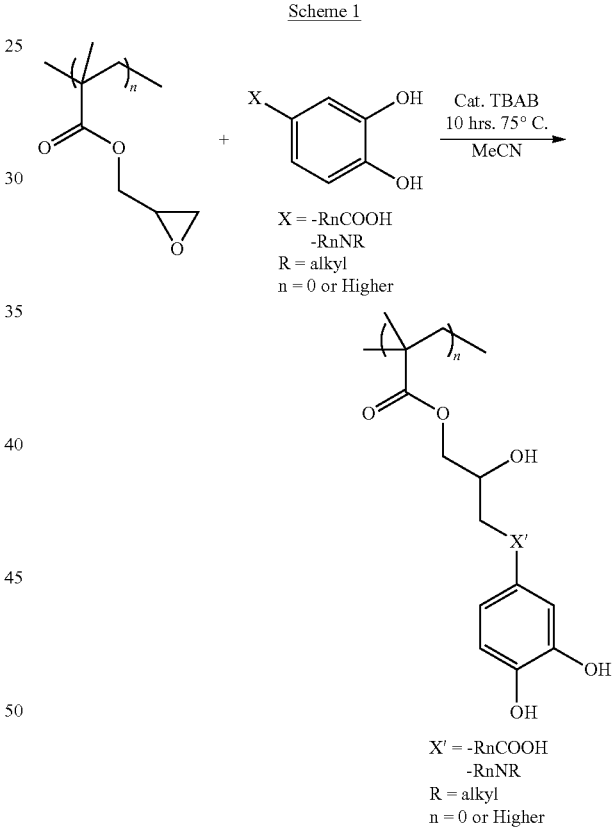

A specifically preferred system as generally exemplified in the following Scheme 2 includes reaction of a catechol reagent with a reactive polymer such as a resin comprising epoxy group to provide a polymer reaction product that comprises 1) pendant catechol moieties and 2) reactive moieties such as hydroxyl, optionally substituted amine or carboxy groups that can participate in crosslinking of a coating layer that contains the polymer reaction product.

Scheme 2

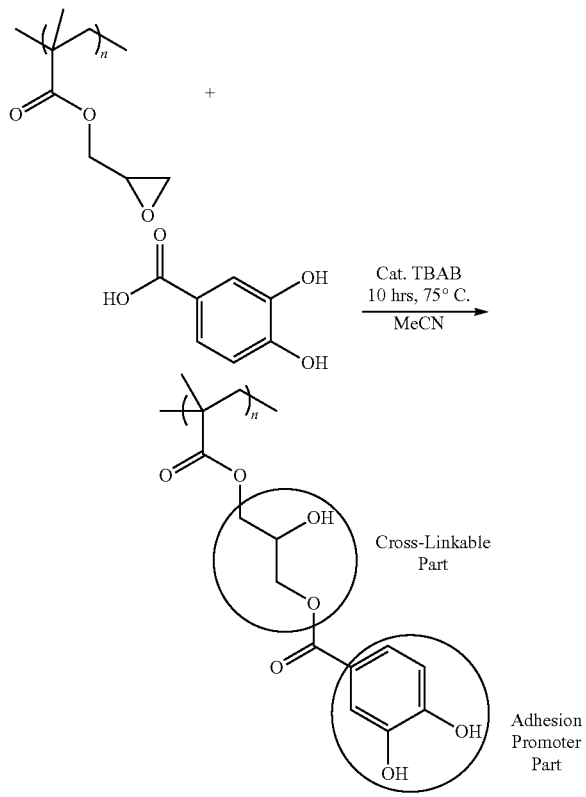

As referred to herein, suitable heteroalkyl include optionally substituted $C_{1-20}$alkoxy, optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; and optionally substituted alkylamine preferably having 1 to about 20 carbon atoms.

It is also understood that the term "heteroalkyl" includes "heteroalicyclic" groups unless otherwise indicated. Heteroalicyclic groups are non-aromatic ring groups that have one or more hetero (e.g. N, O or S) ring atoms. Preferred heteroalicyclic groups have 5 to 20 ring atoms and 1, 2 or 3 N, O or S ring atoms.

The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. In preferred aspects, a straight chain or branched chain alkyl has 30 or fewer carbon atoms in its backbone (e.g., $C_1$-$C_{30}$ for non-cyclic, $C_3$-$C_{30}$ for branched chain), preferably 26 or fewer, and more preferably 20 or fewer, and still more preferably 4 or fewer.

It is also understood that the term "alkyl" includes "carbon alicyclic" groups unless otherwise indicated.

As referred to herein, the term "carbon alicyclic group" means each ring member of the non-aromatic group is carbon. The carbon alicyclic group can have one or more endocyclic carbon-carbon double bonds, provided the ring is not aromatic. The term optionally substituted "cycloalkyl group" means each ring member of the non-aromatic group is carbon and the carbon ring does not have any endocyclic carbon-carbon double bonds. For instance, cyclohexyl, cyclopentyl and adamantyl are cycloalkyl groups as well as carbon alicyclic groups. Carbon alicyclic groups and cycloalkyl groups may comprise one ring or multiple (e.g. 2, 3, 4 or more) bridged, fused or otherwise covalently linked rings.

As referred to herein, a "heteroaryl" group includes an aromatic 5-8 membered monocyclic, 8-12 membered bicyclic, or 11-14 membered tricyclic ring system having 1-3 heteroatoms if monocyclic, 1-6 heteroatoms if bicyclic, or 1-9 heteroatoms if tricyclic, said heteroatoms selected from O, N, or S (e.g., carbon atoms and 1-3, 1-6, or 1-9 heteroatoms of N, O, or S if monocyclic, bicyclic, or tricyclic, respectively), wherein 0, 1, 2, 3, or 4 atoms of each ring may be substituted by a substituent. Examples of heteroaryl groups include pyridyl, furyl or furanyl, imidazolyl, benzimidazolyl, pyrimidinyl, thiophenyl or thienyl, quinolinyl, indolyl, thiazolyl, and the like.

Various materials and substituents (including groups R, $R^1$ and $R^2$ of Formulae (I) and (II) above) that are "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl; heteroaryl, and the like.

A variety of resins may serve as the resin components of an underlying coating composition.

Particularly preferred resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Preferred polyester resins for use in an antireflective composition of the invention are also disclosed in U.S. Pat. No. 8,501,383; U.S. 2011/0033801; and U.S. Pat. No. 7,163,751. As disclosed in those patent documents, resins that contain ester repeat units (polyester) may be suitably provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. In certain aspects, preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

Acrylate-based (including methacrylate-based) resins also are preferred.

Resins of coating compositions of the invention may comprise a variety of additional groups such as cyanurate groups, as disclosed in U.S. Pat. Nos. 6,852,421 and 8,501,383.

As discussed, for antireflective applications, suitably one or more of the compounds reacted to form the resin comprise a moiety that can function as a chromophore to absorb radiation employed to expose an overcoated photoresist coating layer.

Additionally, underlying coating compositions that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contains phenyl, anthracene, naphthyl, etc. units.

Resins that comprise one or more glycidyl moieties and/or aromatic groups with multiple hetero-containing substituents may be readily prepared. For instance, monomers containing the desired groups may be polymerized. Preferred syntheses are set forth in the examples which follow.

Preferably resins of underlying coating compositions of the invention will have a weight average molecular weight (Mw) of about 1,000 to about 10,000,000 daltons, more typically about 2,000 to about 10,000 daltons, and a number average molecular weight (Mn) of about 500 to about 1,000,000 daltons. Molecular weights (either Mw or Mn) of the resins of compositions of the invention are suitably determined by gel permeation chromatography.

The resin component will be the major solids component of an underlying coating composition in many preferred embodiments. For instance, one or resins suitably may be present from 50 to 99.9 weight percent based on total solid content of a coating composition, more typically from 80 or 85 to 95, 98 or 99+(or even 100) weight percent based total solid content of a coating composition. As referred to herein, solids of a coating composition refer to all materials of the coating composition except solvent carrier.

In certain embodiments, a coating composition of the invention may comprise a crosslinker in addition to a resin or other material with glycidyl groups. For example, coating compositions may include amine-based crosslinkers such as melamine materials, including melamine resins such as manufactured by Cytec Industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Resins containing glycidyl groups and/or aromatic groups with multiple hetero-containing substituents of a coating composition of the invention in general is present in an amount of between about 5 and 100 weight percent of total solids (all components except solvent carrier) of the coating composition, more typically at least about 20, 30 40, 50, 60, 70, 80, 90 or 100 weight percent of total solids (all components except solvent carrier) of the coating composition.

If a coating composition contains 1) a first polymer comprising glycidyl group and 2) a second polymer (distinct from the first polymer) that comprise s aromatic groups with multiple hydroxyl, thiol and/or amine groups, each such polymer is suitably present in an amount of between about 5 and 95 weight percent of total solids (all components except solvent carrier) of the coating composition, more typically at least about 10, 20, 30 40, 50, 60, 70, 80, or 90 weight percent of total solids (all components except solvent carrier) of the coating composition.

Preferred coating compositions of the invention also may contain a thermal acid generator compound. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt (e.g. toluene sulfonic acid ammonium salt), for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 0.5 to 2 percent by weight of the total dry components.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Exemplary Photoresist Systems

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (V), a lactone-containing monomer of the following formula (VI), a base-soluble monomer of the following formula (VII) for adjusting dissolution rate in alkaline developer, and an acid-generating monomer of the following formula (VIII), or a combination comprising at least one of the foregoing monomers:

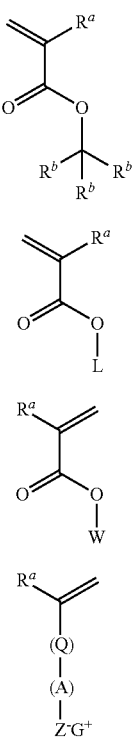

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the acid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

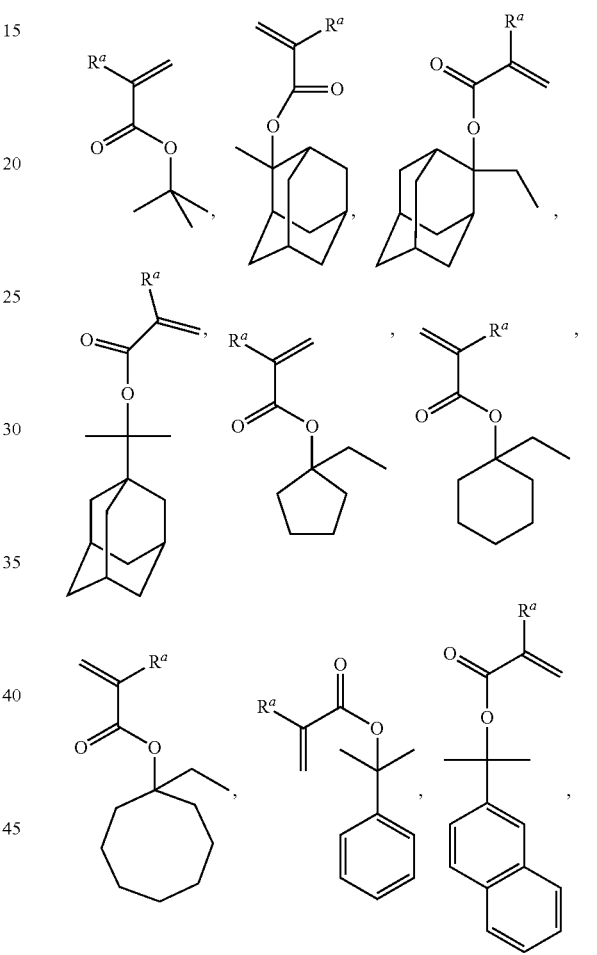

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

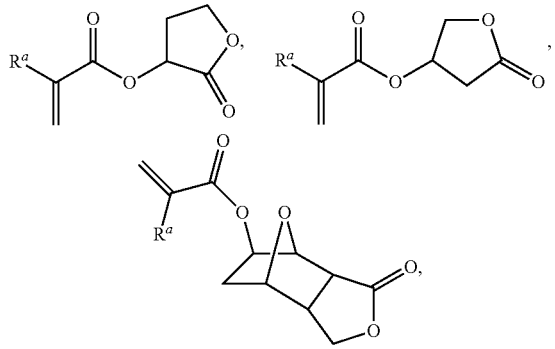

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

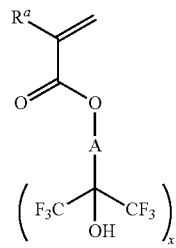

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

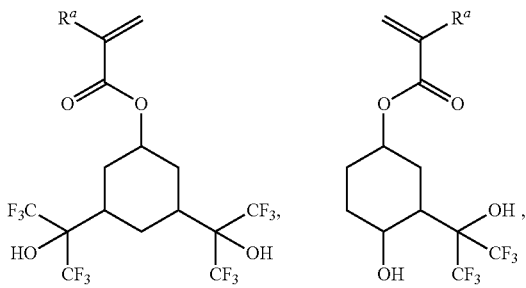

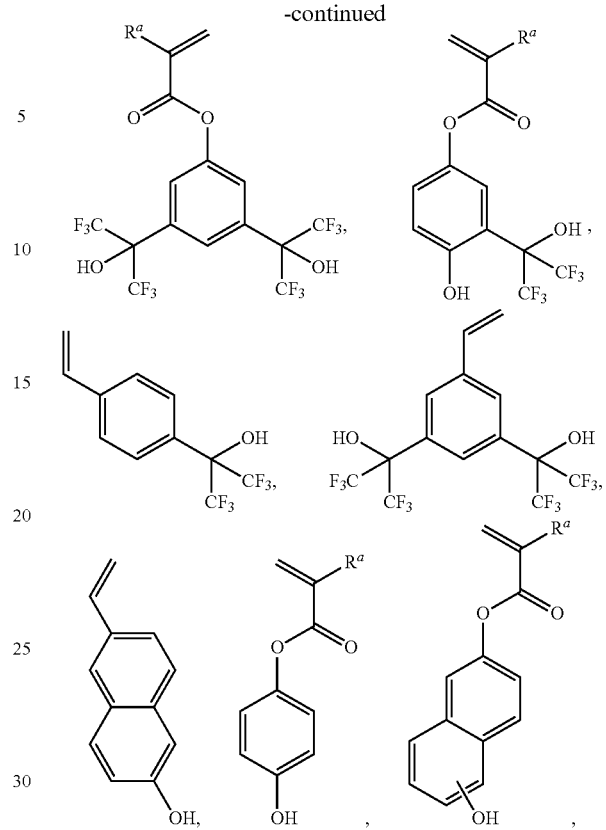

or a combination comprising at least one of the foregoing, wherein $R^a$ is H, F, —CN, $C_{1-6}$ alkyl, or $C_{1-6}$ fluoroalkyl.

Preferred acid generating monomers include those of the formulae (XI) or (XII):

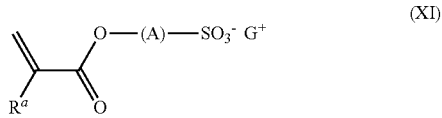

(XI)

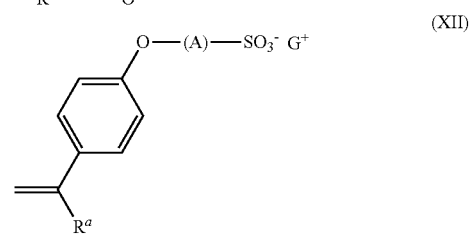

(XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C$(R^1)_2)_x$C(=O)O]$_b$—C(($R^2)_2)_y$(CF$_2)_z$— group, or an o-, m- or p-substituted —$C_6F_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred acid generating monomers include:

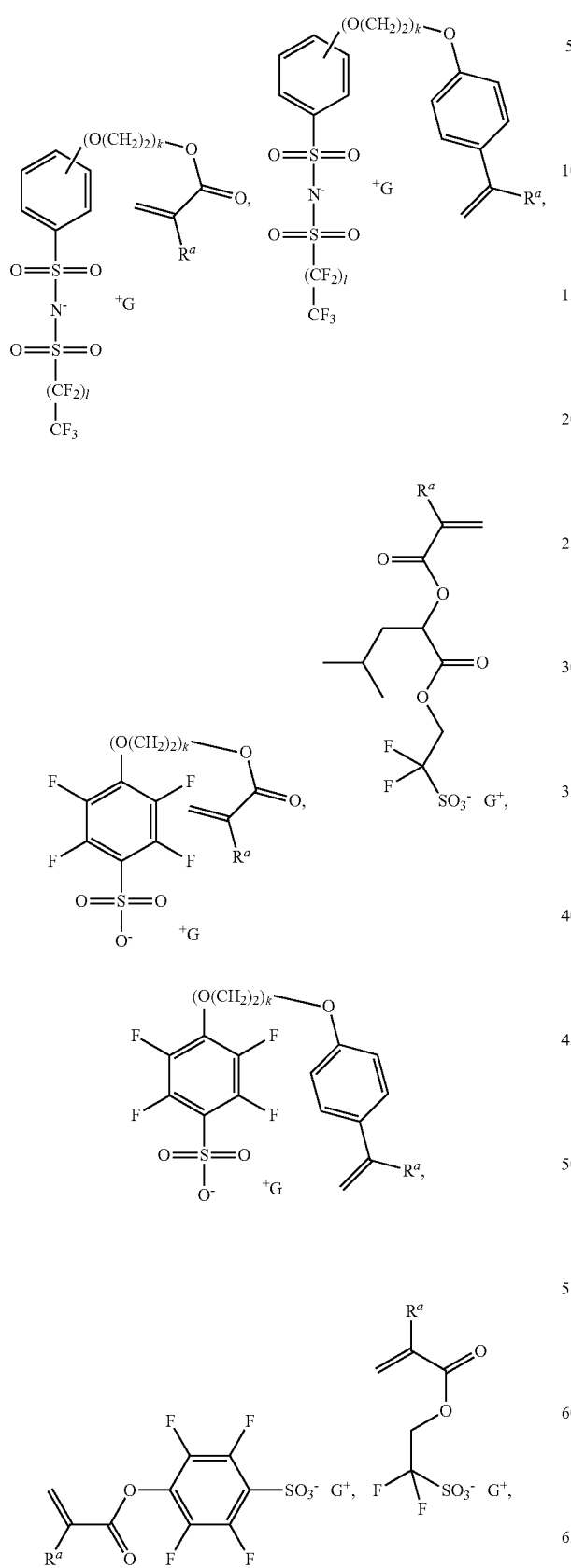

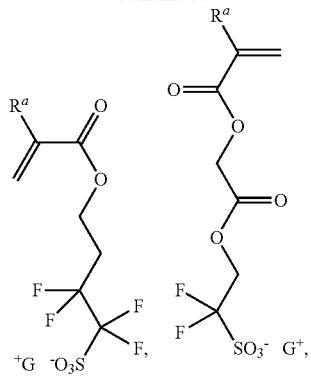

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation. $G^+$ as referred to herein throughout the various formulae may be an acid generator as disclosed herein and comprise an oxo-dioxolane moiety and/or an oxo-dioxane moiety.

Preferred acid-generating monomers may include sulfonium or iodonium cation. Preferably, in formula (IV), $G^+$ is of the formula (XIII):

(XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

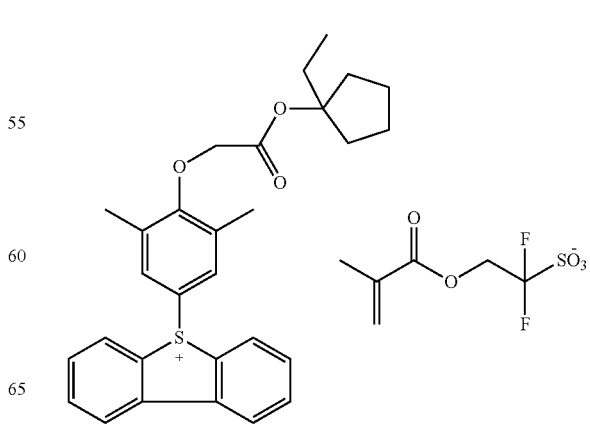

31
-continued

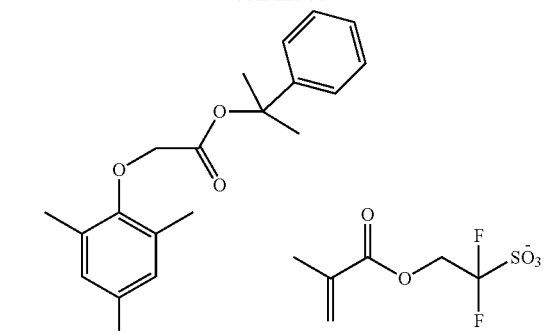

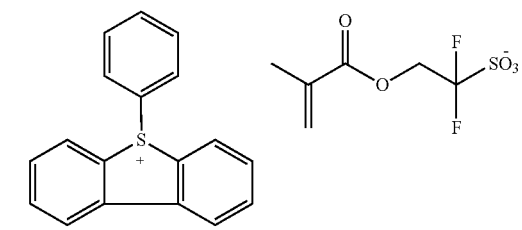

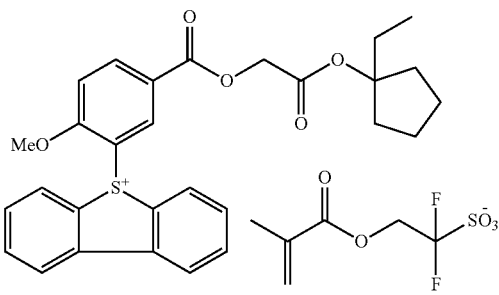

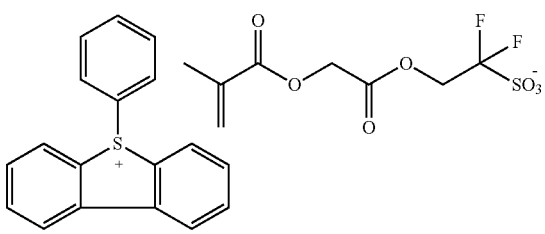

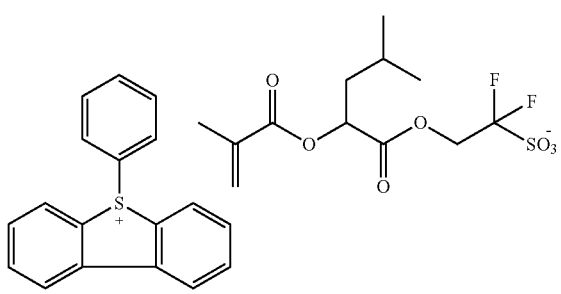

32
-continued

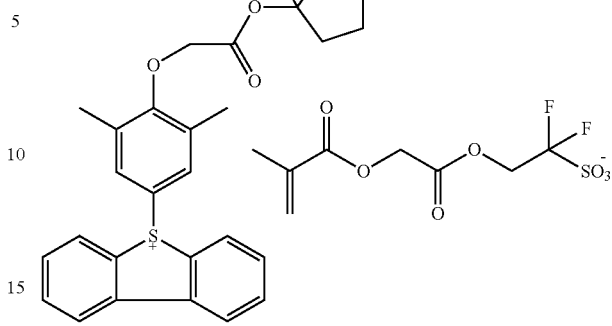

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Additional preferred resins for use in photoresists to be imaged at sub-200 nm, such as at 193 nm, comprises units of the following general formulae (I), (II) and (III):

Preferred resins for use in photoresists to be imaged at sub-200 nm, such as at 193 nm, comprise units of the following general formulae (I), (II) and (III):

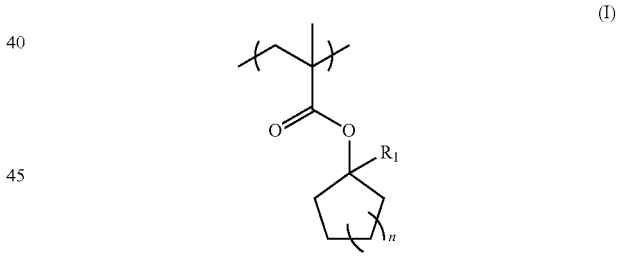

(I)

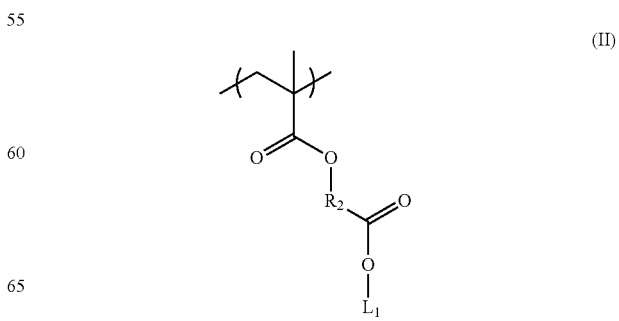

(II)

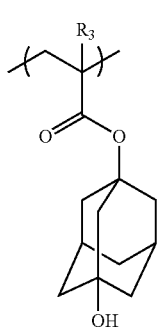

(III)

wherein: $R_1$ is a $(C_1-C_3)$alkyl group; $R_2$ is a $(C_1-C_3)$alkylene group; $L_1$ is a lactone group; and n is 1 or 2.

Polymers for use in photoresists of the invention may suitably vary widely in molecular weight and polydispersity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis(2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

As discussed, in certain aspects, a wet etch process may be suitably employed. Wet etching may be suitably carried out by exposing the surface to be etched (e.g. a metal nitride, or metal nitride coated with one or more organic and/or inorganic layers) with a wet etch composition for a time and temperature effective to etch the surface (e.g. metal nitride surface and/or coating layers thereon). Exemplary wet etching compositions include an aqueous mixture of ammonium hydroxide and a peroxide such as hydrogen peroxide, or a mixture of an acid such as sulfuric acid and a peroxide such as hydrogen peroxide. See US 2006/0226122 for exemplary compositions. The examples which follow also provide exemplary wet etch process conditions. As referred to herein, a "wet etch process" means treating substrate areas defined by a adjoining photoresist (after development of the photoresist image) with a fluid composition typically either acid or alkaline in combination with a peroxide agent, but in any event distinguished from a plasma dry etch.

The following non-limiting examples are illustrative of the invention.

General Comments

The following polymers P1 through P9 are described in the examples which follow. Polymer P3 was purchased from Nisso, Japan, Mw=5.3K, PDI=1.1. Polymers P4, P5, P6 and P7 were provided by Miwon Chemical, Korea.

P1
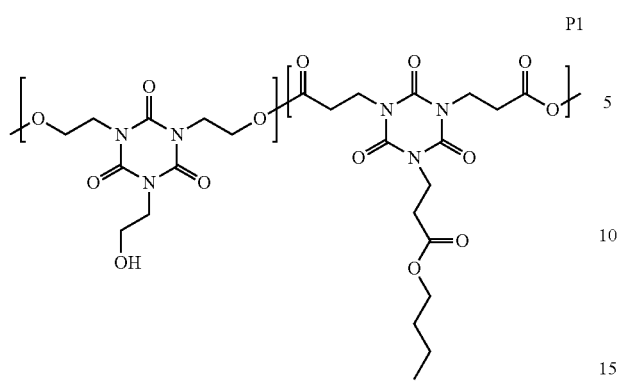

P2
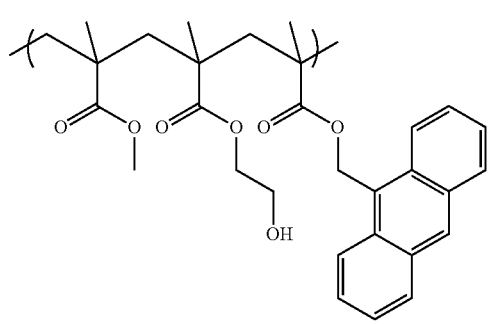

P3
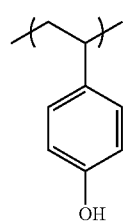

P4
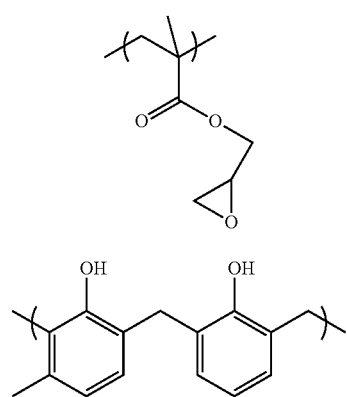

P5

P6
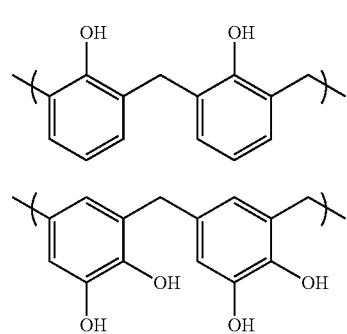

P7

P8
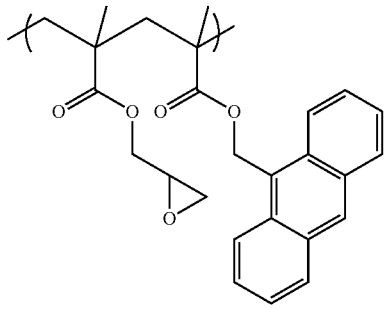

P9
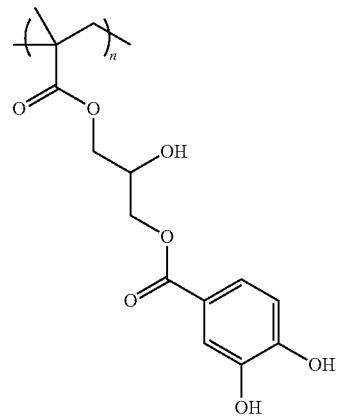

Examples 1-4: Polymer Syntheses

Example 1: Synthesis THEIC-TCEIC Copolymer P1

P1
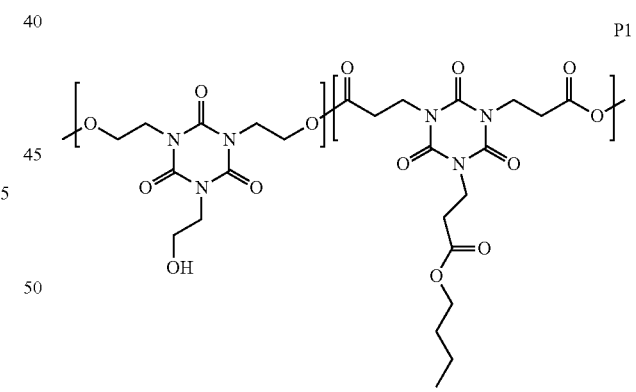

THEIC (Tris(2-hydroxyethyl)iso-cyanurate) (30.43 g, 116.5 mmol), TCEIC (Tris(2-carboxyethyl) iso-cyanurate) (20.11 g, 58.2 mmol), n-Butanol (20.11 g, 271.5 mmol), p-TSA (p-Toulenesulfonic acid) (0.53 g, 2.8 mmol) were dissolved in 34 g of anisole. The mixture was heated to 150° C. and maintained at that temperature for 3 hours. The reaction mixture was cooled to 120° C. and diluted by addition 78 g of HBM (2-hydroxyisobutyric acid methyl-ester). Residual monomers were removed by precipitation with excess isopropyl alcohol resulting in the depicted copolymer 1 as a white powder. [Mw 7 k, PDI=1.4; THEIC: TCEIC=66:34 mol %, by $^{13}$C-NMR].

Example 2: Synthesis of Poly(ANTMA-co-HEMA-co-MMA) P2

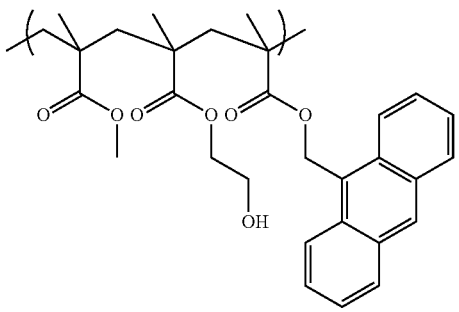

P2

A polymer feed solution was prepared by combining 20.5 g methylanthracene methacrylate monomer, 15.5 g 2-hydroxyethyl methacrylate monomer, 14.0 g methyl methacrylate, and 50 g of propylene glycol monomethyl ether acetate (PGMEA) in a 250 ml three neck, round-bottom flask fitted with a mechanical stirrer, thermal controller, thermal probe, heating mantle, and nitrogen purge inlet (sweep). The reaction mixture was heated until the temperature of the reaction mixture reached 80° C. 16.15 g of PGMEA solution containing 10 wt % of Vazo 67 azo initiator (white powder, Dupont) was next added to the flask. The flask was heated until the temperature of the reaction mixture reached 90° C. and maintained for 6 hours with stirring. Heating was stopped and the reactor was allowed to cool down to 40° C. Un-reacted monomers were eliminated in vacuum condition and the resulting polymer solution was diluted to 17 wt % (+/−5 wt %) with PGMEA. The resulting polymer 2 solution displayed [Mn 2776; Mw 8160; PDI 2.9 PDI; ANTMA:HEMA:MMA=20:35:45 mol %, by $^{13}$C-NMR].

Example 3: Synthesis of Poly(ANTMA-co-GMA) P8

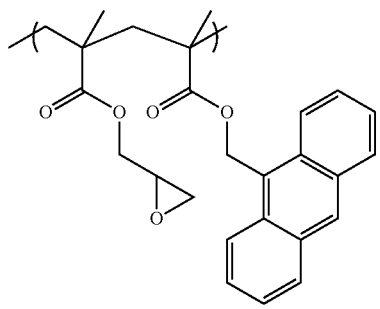

P8

A 250 ml round bottom, 3-neck flask (reactor) was charged with 75 g PGMEA (solvent) and then the flask was connected to condenser, a thermal couple to reach the solvent for measuring and controlling the temperature of the solvent throughout the polymerization. The temperature of the solvent inside the reactor was set at 80° C. 1° C. A feed solution was prepared by combining 22.72 g methylanthracene methacrylate monomer, 27.28 g glycidyl methacrylate monomer, 1.26 g V-601 initiator (2 mol %) and 75 g of propylene glycol monomethyl ether acetate (PGMEA) in a 250 ml glass bottle, and then it was shank to completely dissolve the monomer and initiator. The bottle was then placed back to the ice bath. Once the reactor reached the set temperature (80° C.), 3.16 g V-601 initiator (5 mol %) was dumped to the flask and stirred for approximately 10 minutes. The temperature reached back to the 80° C.±1° C., the feeding solution was fed into the reactor flask for 120 minutes. After feeding, the reactor was maintained at 80° C. for additional 1 hour, the heating was then removed and the reactor allowed to cool to room temperature with stirring. The resulting polymer solution was precipitated with methyl alcohol (10× excess of reaction mixture), filtered and vacuum dried, to provide resulting polymer 3 which displayed [Mw 8.5K; PDI 1.6; ANTMA:GMA=27:73 mol %, by $^{13}$C-NMR].

Example 4: Synthesis of Catecholated Polymer by Post-Modification—Polymer P9

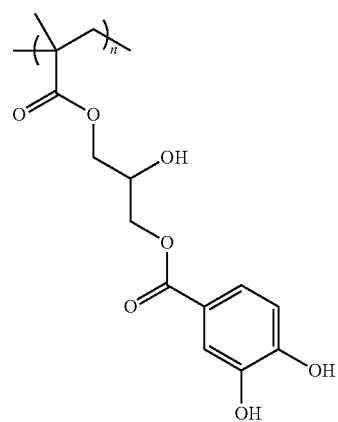

P9

To a 250 mL round bottom flask equipped with magnetic stir bar was charged poly(glycidyl methacrylate) (10.00 g, 0.069 mol), 3,4-dihydroxybenzoic acid (10.71 g, 0.035 mol), and dry CH$_3$CN (210 mL). To this solution was added 1 mol % of tetrabutylammonium bromide (0.35 mmol) while stirring and the resulting mixture was heated to 75° C. and allowed to stir for 10 hrs. The resulting clear solution was cooled to ambient temperature and concentrated by rotary evaporation to give a 10.24 g of viscous clear liquid. The resulting crude polymer was dissolved in THF, precipitated from cold IPA, and dried in vacuo 48 hours. Catechol functionalized polymer P9 (Mw 6.5 k) was isolated as a dry white powder in 40% yield.

Examples 5-15 and Comparative Examples 1-2

BARC compositions are prepared by combining the components in the amounts shown in Table 1. The solutions are filtered through a PTFE filter having a 0.45 micron pore size to provide BARC compositions. In Table 1, the specified polymers P1 through P9 have the structures as set forth above under General comments; PGMEA=propylene glycol monomethyl ether acetate; HBM=methyl-2-hydroxy isobutyrate; T1=p-toluenesulfonic acid ammonium salts; C-1=tetramethoxymethyl glycouril and F-1=fluorochemical surfactant Polyfox 656 from OMNOVA Solutions Inc.

TABLE 1

| BARC Comp'n | Polymer | X-linker | Catalyst | Surfactant | Solvent |
|---|---|---|---|---|---|
| 5 | P3 (1.2 g) P4 (3.5 g) | | | F-1(2.4 mg) | PGMEA(95.3 g) |
| 6 | P5 (2.3 g) P4 (2.3 g) | | | F-1(2.4 mg) | PGMEA(95.3 g) |
| 7 | P6 (2.3 g) P4 (2.3 g) | | | F-1(2.4 mg) | PGMEA(95.3 g) |
| 8 | P7 (2.3 g) P4 (2.3 g) | | | F-1(2.4 mg) | PGMEA(95.3 g) |
| 9 | P7 (1.2 g) P4 (3.5 g) | | | F-1(2.4 mg) | PGMEA(95.3 g) |
| 10 | P7 (1.6 g) P4 (3.1 g) | | | F-1(2.4 mg) | PGMEA(95.3 g) |
| 11 | P7 (1.4 g) P4 (3.3 g) | | | F-1(2.4 mg) | PGMEA(95.3 g) |
| 12 | P7 (1.2 g) P4 (2.1 g) P8 (1.4 g) | | | F-1(2.4 mg) | PGMEA(95.3 g) |
| 13 | P7 (1.6 g) P4 (1.8 g) P8 (1.3 g) | | | F-1(2.4 mg) | PGMEA(95.3 g) |
| 14 | P1 (3.7 g) P7 (1.1 g) | C-1 (0.54 g) | T1 (43.5 mg) | F-1(2.7 mg) | PGMEA(8.2 g)/HBM(156.1 g) |
| 15 | P2 (3.7 g) P7 (1.1 g) | C-1 (0.54 g) | T1 (43.5 mg) | F-1(2.7 mg) | PGMEA(8.2 g)/HBM(156.1 g) |
| Comparative 1 | P1 (4.8 g) | C-1 (0.54 g) | T1 (43.5 mg) | F-1(2.7 mg) | PGMEA(8.2 g)/HBM(156.1 g) |
| Comparative 2 | P2 (4.8 g) | C-1 (0.54 g) | T1 (43.5 mg) | F-1(2.7 mg) | PGMEA(8.2 g)/HBM(156.1 g) |

Example 16: Test of Wet Etch Resistance on TiN Substrate of Composition Examples BARC compositions were each spin-coated on 4 cm×4 cm TiN coupon wafers at 1500 rpm, and then baked at 215° C. for one minute using mini coating machine. The BARC coating thickness after bake was 1000 Å. Spin casted BARC films were placed on wafer holder for dipping into a wet etch chemical for TiN known as an SC-1 mixture. The SC-1 mixture used in this test has $NH_4OH:H_2O_2:H_2O=1:4:20$ weight ratio. After dipping BARC films in SC-1 mixture, SC-1 was heated to 50° C. Wet etch resistance samples showed long endure time at these conditions without any peeling off of BARC films while poor adhesion BARCs were peeled off within short time. Endure time by monitoring film peeling in the SC-1 mixture was used as evaluation performance.

| Composition of Example no. | Endure time at 50° C. | Endure time at 70° C. |
|---|---|---|
| 5 | 330 sec | 40 sec |
| 6 | 600 sec | 70 sec |
| 7 | >600 sec | 105 sec |
| 8 | >600 sec | >180 sec |
| 9 | >600 sec | >180 sec |
| 10 | >600 sec | >180 sec |
| 11 | >600 sec | >180 sec |
| 12 | >600 sec | >180 sec |
| 13 | >600 sec | >180 sec |
| 14 | 150 sec | 60 sec |
| 15 | 210 sec | 60 sec |
| Comparative example 1 | 45 sec | <10 sec |
| Comparative example 2 | 50 sec | <10 sec |

Comparative examples 1 and 2 represent commercially available BARC compositions widely used in ArF and KrF. They showed insufficient endure time at this wet etch resistance evaluation. By use of catechol or glycidyl containing polymers (Examples 14 and 15 versus comparative examples 1 and 2), wet etch endure time on TiN substrate were significantly improved. The best performance was achieved by combination of catechol and glycidyl homopolymers (Example 8, 9, 10 and 11) rather than BARC compositions including one of them (Example 14, 15)

Example 17: Measurement of Optical Properties and Solvent Resistance of BARC Compositions Each sample solution tested for optical properties and solvent resistance was spin-coated onto a Si wafer and baked at 215 C for 60 sec. The n/k values and thickness of films on the Si wafer were measured using ellipsometry. PGME/PGMEA=70:30 wt % mixture solution, commonly used in photoresist art, was then poured over the surface of the BARC film and allowed to sit for 90 seconds. The wafer was then spun dry at 4000 rpm for 60 seconds. After additional bake at 110 C for 60 seconds for solvent removal. The difference between final and initial thickness is reported as a solvent strip value.

| Composition of Example No. | n/k @ 193 or 248 | Strip loss (%) |
|---|---|---|
| 5 | 1.68/0.31@193 | 0% |
| 6 | 1.54/0.3@193 | −0.2% |
| 7 | 1.42/0.6@193 | −0.1% |
| 8 | 1.47/0.4@193 | −0.1% |
| 9 | 1.57/0.21@193 | −0.1% |
| 10 | 1.53/0.27@193 | −0.1% |
| 11 | 1.55/0.25@193 | −0.05% |
| 12 | 1.68/0.22@248 | −0.1% |
| 13 | 1.73/0.22@248 | −0.2% |
| 14 | 1.70/0.31@193 | −0.2% |
| 15 | 1.50/0.3@248 | −0.2% |
| Comparative example 1 | 1.96/0.26@193 | −0.1% |
| Comparative example 2 | 1.45/0.6@248 | −0.2% |

Example 18—Lithographic Processing

BARC composition of Examples 8 and 10 were each spin-coated on 150-mm silicon wafers at 1500 rpm, and then baked at 215° C. for one minute using a TEL ACT 8 wafer coating track machine. The BARC coating thickness after bake was 1000 Å. Dow EPIC2150 photoresist was spin-coated on top of the BARC coating and baked at 125° C. for 60 seconds to give a 170 nm thick layer of photoresist. The photoresist was next exposed through a target mask using a Nikon 306C 193 nm ArF scanner with 0.78 NA. The photoresist layer was next post-exposure baked at 105° C. for 60 seconds, and then developed using Dow MF™ CD-26 TMAH developer in a standard 60 second single puddle process. Scanning electron microscopy at 150 k magnification was conducted to examine the quality of the photoresist pattern profiles.

The BARC coatings using the BARC compositions of Examples 12 and 13 were prepared under the same conditions with BARC compositions of Examples 8 and 10 for KrF lithography. Commercially available Dow UV™1610 DUV photoresist was spin-coated on top of the BARC coating and baked at 100° C. for 60 seconds to give a 280 nm thick layer of photoresist. The photoresist was next exposed through a target mask using a 248 nm KrF wafer stepper with 0.65 NA. The photoresist layer was next post-exposure baked at 120° C. for 60 seconds, and then developed using Dow MF™ CD-26 TMAH developer in a standard 60 second single puddle process. Scanning electron microscopy at 80 k magnification was conducted to examine the quality of the photoresist pattern profiles. BARC composition of examples 8 and 10, 12 and 13 showed good lithographic performance both of ArF and KrF with reference materials.

What is claimed is:

1. A method for forming a photoresist relief image, comprising:
   a) applying on a substrate a layer of a coating composition comprising:
      1) a first resin that comprises one or more glycidyl groups and
      2) a second resin that comprises one or more catechol groups;
   b) applying a layer of a photoresist composition above the coating composition layer; and
   c) exposing the photoresist composition later to activating radiation and developing the exposing photoresist composition layer to provide a photoresist composition relief image.

2. The method of claim 1 wherein the coating composition comprises a resin that comprises both 1) one or more glycidyl groups and 2) one or more aromatic groups that each comprises two or more substituents that comprise hydroxy, thiol and/or amine moieties.

3. The method of claim 1 wherein photoresist relief images are transferred to substrates by a wet etch process.

4. The method of claim 1 wherein the substrate comprises $SiO_2$ or TiN.

5. The method of claim 1 wherein the one or more catechol groups are phenyl groups that are unsubstituted at ring positions other than linkage to the resin and two hydroxyl ring substituents.

6. A coated substrate comprising:
   a substrate having thereon:
   a) a coating composition comprising:
      1) a first resin that comprises one or more glycidyl groups and
      2) a second resin that comprises one or more catechol groups; and
   b) a layer of a photoresist composition above the coating composition layer.

7. The substrate of claim 6 wherein the one or more catechol groups are phenyl groups that are unsubstituted at ring positions other than linkage to the resin and two hydroxyl ring substituents.

* * * * *